(12) United States Patent
Lee et al.

(10) Patent No.: US 6,987,308 B2
(45) Date of Patent: Jan. 17, 2006

(54) FERROELECTRIC CAPACITORS WITH METAL OXIDE FOR INHIBITING FATIGUE

(75) Inventors: Moon-sook Lee, Seoul (KR);
Kun-sang Park, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 11/009,809

(22) Filed: Dec. 10, 2004

(65) Prior Publication Data

US 2005/0106761 A1    May 19, 2005

Related U.S. Application Data

(62) Division of application No. 10/464,993, filed on Jun. 19, 2003, now Pat. No. 6,872,618.

(30) Foreign Application Priority Data

Jun. 26, 2002    (KR)    ...... 10-2002-0035929

(51) Int. Cl.
*H01L 29/72*    (2006.01)
(52) U.S. Cl. ............ 257/532; 257/296; 257/310
(58) Field of Classification Search ......... 257/68, 257/71, 296, 300, 303, 306, 516, 532, 295, 257/310, 311, E21.664, E29.342, E29.343, 257/E29.345, 638, 635, 632, E27.034
See application file for complete search history.

(56) References Cited

U.S. PATENT DOCUMENTS

| 4,200,502 | A | * | 4/1980 | Munz et al. ........... 205/125 |
| 5,214,300 | A | | 5/1993 | Rohrer et al. ........... 257/295 |
| 5,994,183 | A | * | 11/1999 | Huang et al. ........... 438/256 |
| 6,081,417 | A | | 6/2000 | Matsuki ........... 361/311 |
| 6,337,238 | B1 | * | 1/2002 | Nakabayashi ........... 438/240 |
| 6,339,527 | B1 | * | 1/2002 | Farooq et al. ........... 361/305 |
| 6,355,492 | B1 | | 3/2002 | Tanaka et al. ........... 438/3 |
| 6,454,914 | B1 | | 9/2002 | Nakamura ........... 204/192.17 |
| 2001/0053593 | A1 | | 12/2001 | Wilk et al. ........... 438/585 |
| 2002/0115226 | A1 | | 8/2002 | Mikawa et al. ........... 438/3 |
| 2002/0187613 | A1 | | 12/2002 | Han et al. ........... 438/395 |

FOREIGN PATENT DOCUMENTS

| KR | 2001-0062842 | 7/2001 |
| KR | 10-2002-0047515 | 6/2002 |

* cited by examiner

*Primary Examiner*—George Fourson
*Assistant Examiner*—Joannie Adelle García
(74) *Attorney, Agent, or Firm*—Myers Bigel Sibley & Sajovec, P.A.

(57) ABSTRACT

A method of forming a ferroelectric capacitor includes forming a lower electrode on a substrate. The lower electrode is oxidized to form a metal oxide film. A ferroelectric film is formed on the metal oxide film while reduction of the oxygen content of the metal oxide film is inhibited. An upper electrode is formed on the ferroelectric film.

9 Claims, 13 Drawing Sheets

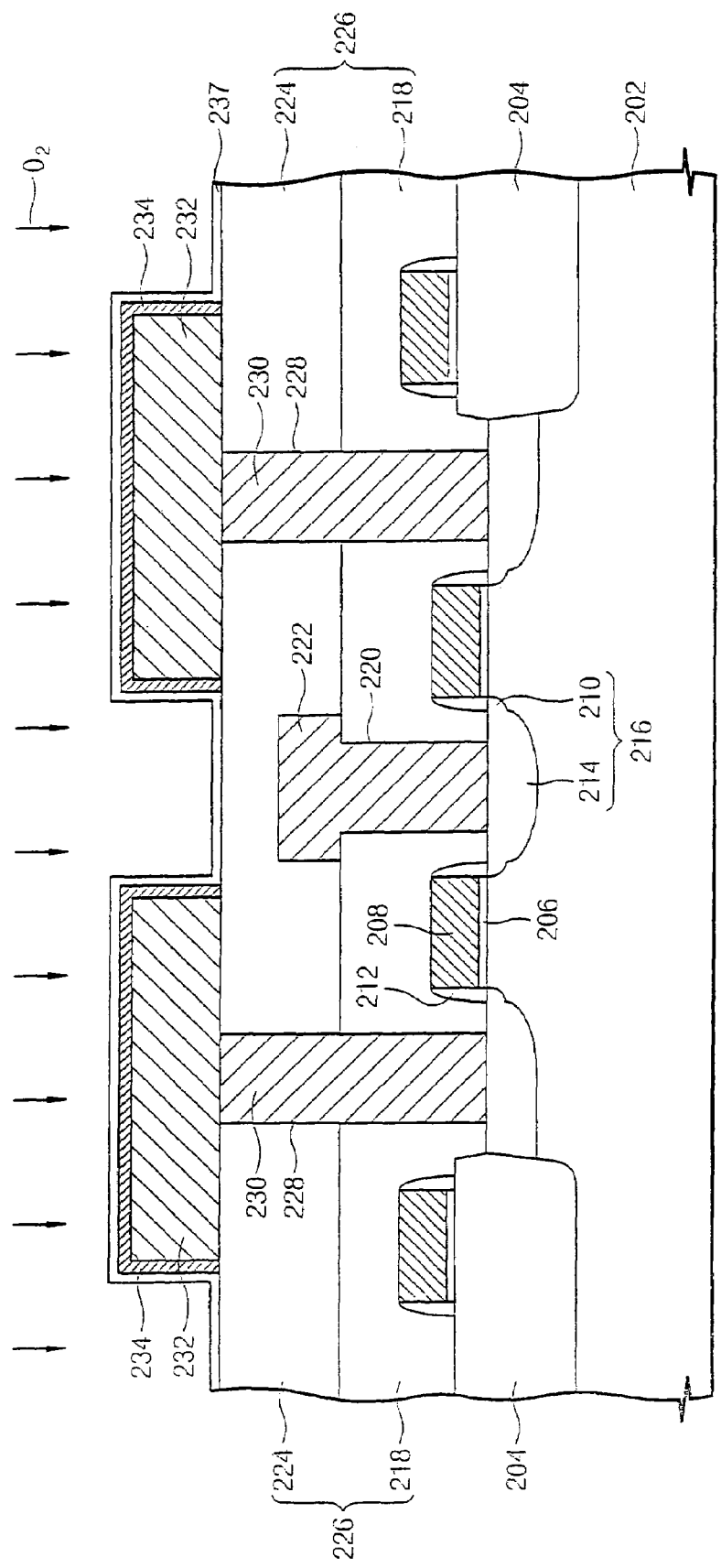

FERROELECTRIC CAPACITORS WITH METAL OXIDE FOR INHIBITING FATIGUE

RELATED APPLICATION

This application is a divisional application of U.S. patent application Ser. No. 10/464,993, filed on Jun. 19, 2003 now U.S. Pat. No. 6,872,618 and claims priority from Korean Patent Application No. 10-2002-0035929, filed Jun. 26, 2002, the disclosures of which are hereby incorporated herein by reference in their entirety as if set forth fully herein.

FIELD OF THE INVENTION

The present invention relates to ferroelectric capacitors, and more particularly, to ferroelectric capacitors having a ferroelectric layer on a lower electrode, and methods of fabricating the same.

BACKGROUND OF THE INVENTION

Ferroelectric random access memories (FRAMs) are a type of nonvolatile memory devices that use remnant polarization that remains after a voltage potential is applied to a ferroelectric material and then removed. FRAM devices are nonvolatile in that stored information remains after power is turned off, and may be high speed, large capacity and low power. FRAM devices can include a thin film ferroelectric material of $Pb(Zr_xTi_{1-x})O_3$ ('PZT'), $SrBi_2Ta_2O_9$ ('SBT'), $Sr_xBi_{2-y}(Ta_iNb_j)_2O_{9-z}$ ('SBTN'), $Bi_{4-x}La_xTi_3O_{12}$ ('BLT').

Because ferroelectric materials are crystalline, it may be important to provide a lower electrode material beneath the ferroelectric material. The lower electrode material can be platinum (Pt), iridium (Ir), ruthenium (Ru) or the like, or can be a hybrid electrode ruthenium oxide ($RuO_x$) that is stacked on the aforementioned materials. A hybrid electrode can include an oxide film that may inhibit or improve a fatigue phenomenon in which a remnant polarization (Pr) value decreases over time as an electric pulse is applied and switched. The fatigue phenomenon may be due to an oxygen depletion defect that can occur in a boundary between a ferroelectric and an electrode material. Providing an oxidation film between the ferroelectric and the electrode material may reduce oxygen depletion at the interface so that the fatigue phenomenon is inhibited or improved.

A semiconductor device including a ferroelectric planar capacitor with an oxide electrode is shown in FIG. 1A. Referring to FIG. 1A, a device isolation region (field oxide) 4 for defining active region is formed on a substrate 2. A gate electrode 8 is formed on the substrate 2 having the device isolation region 4. A gate insulating film 6 is interposed between the gate electrode 8 and the substrate 2. A gate spacer 12 is formed on sidewalls of the gate electrode 8. Source and drain regions 16 each consisting of a lightly doped region 10 and a heavily doped region 14 are formed in the substrate 2 adjacent to the gate electrode 8. On the substrate including the gate electrode 8 is formed a first interlayer insulating layer 18. A bit line 22 is formed such that it penetrates the first interlayer insulating layer 18 and electrically contacts with the drain region 16. A second interlayer insulating layer 24 is formed on the bit line 22 and the first interlayer insulating layer 18. A contact plug 30 is formed such that it penetrates an interlayer insulating layer 26 including the second interlayer insulating layer 24 and the first interlayer insulating layer 18 and electrically contacts with the source region 16. On the interlayer insulating layer 26 including the contact plug 30 is formed a planar type lower electrode 36 consisting of a metal film 32 electrically connected with the contact plug 30 and a metal oxide film 34. A ferroelectric film 40 and upper electrode 42 are stacked on the lower electrode 36.

Although the hybrid lower electrode may reduce the occurrence of polarization fatigue, the stacked metal film and the metal oxide film may be difficult to fabricate as thin films and the fabrication process may be more complicated. Additionally, the ferroelectric film 40 may be degenerated during a subsequent etch process for forming a planar capacitor. It may also be difficult to manufacture the three-dimensional structure capacitors as shown in FIGS. 1B and 1C using a stacked hybrid electrode.

Referring to FIG. 1B, a stack type hybrid lower electrode 37 is shown in which a metal film 33 and a metal oxide film 35 are stacked and then patterned. A ferroelectric film 41 is deposited on the lower electrode 37.

As shown in FIG. 1C, the metal film 33 and the metal oxide film 35 are respectively patterned to form the hybrid lower electrode 37. The ferroelectric film 41 is formed on the hybrid lower electrode 37. Alignment margins during the associated photolithography process may become difficult to achieve as integration density is increased, and the fabrication process may become more difficult.

SUMMARY OF THE INVENTION

Various embodiments of the present invention provide methods of forming a ferroelectric capacitor. A lower electrode is formed on a substrate. The lower electrode is oxidized to form a metal oxide film. A ferroelectric film is formed on the metal oxide film while reduction of the oxygen content of the metal oxide film is inhibited. An upper electrode is formed on the ferroelectric film. The ferroelectric film may be formed on the metal oxide film while supplying an oxygen partial pressure that is higher than an oxygen partial pressure necessary to form the ferroelectric film. The higher oxygen partial pressure atmosphere used when forming the ferroelectric film may increase oxygen in the metal oxide film, and may thereby reduce or inhibit the fatigue phenomenon. The ferroelectric film may be formed by forming a first ferroelectric film having a first thickness, thermally annealing the first ferroelectric film in an oxygen atmosphere to increase oxygen in the metal oxide film, and forming a second ferroelectric film on the first ferroelectric film. Accordingly, the increased oxygen in the metal oxide film may reduce or inhibit a fatigue phenomenon in the ferroelectric capacitor.

BRIEF DESCRIPTION OF THE DRAWINGS

FIGS. 6A to 6B are sectional views showing fabrication of a semiconductor device having a stack type capacitor according to a second embodiment of the present invention.

DETAILED DESCRIPTION

Figure 1A:
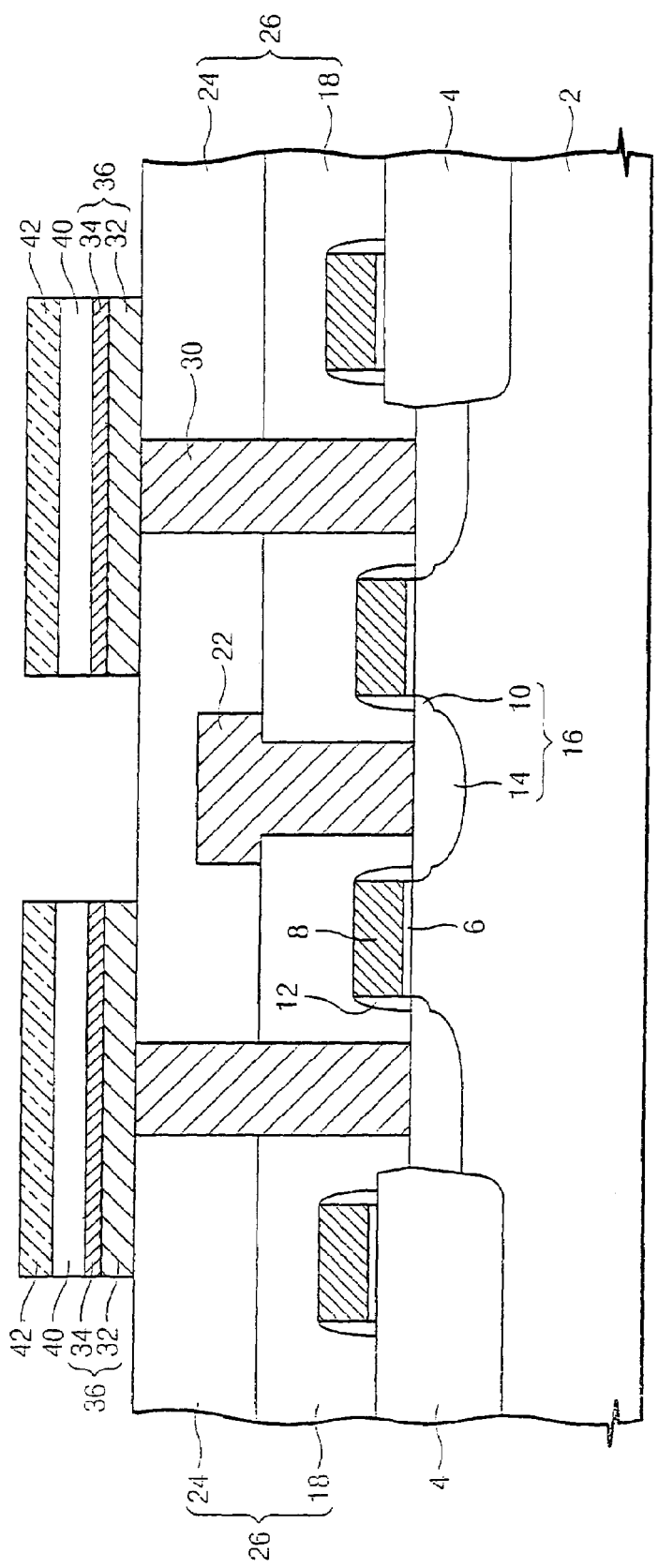
FIGS. 1A to 1C are sectional views of a conventional ferroelectric semiconductor device.
Figure 1B:
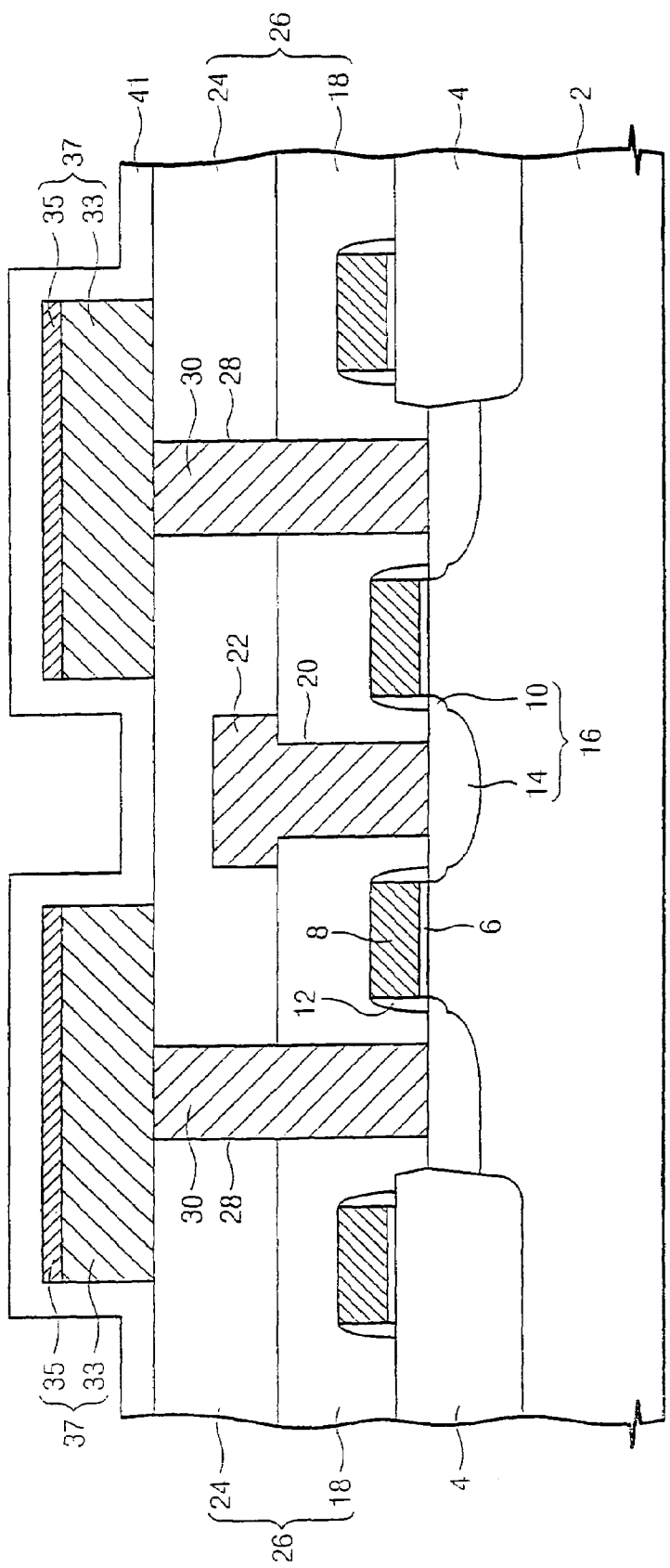
Figure 1C:
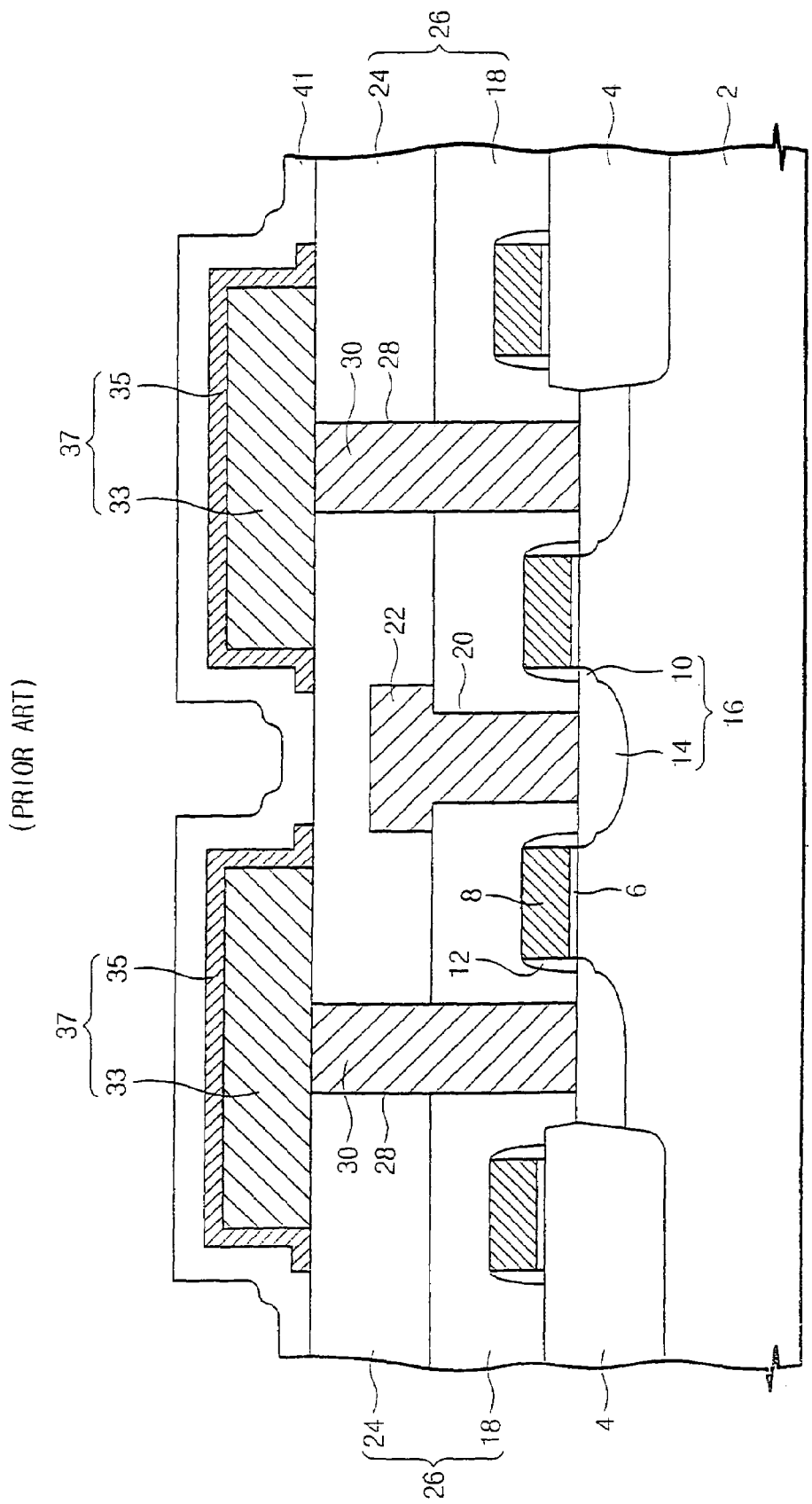

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 2:
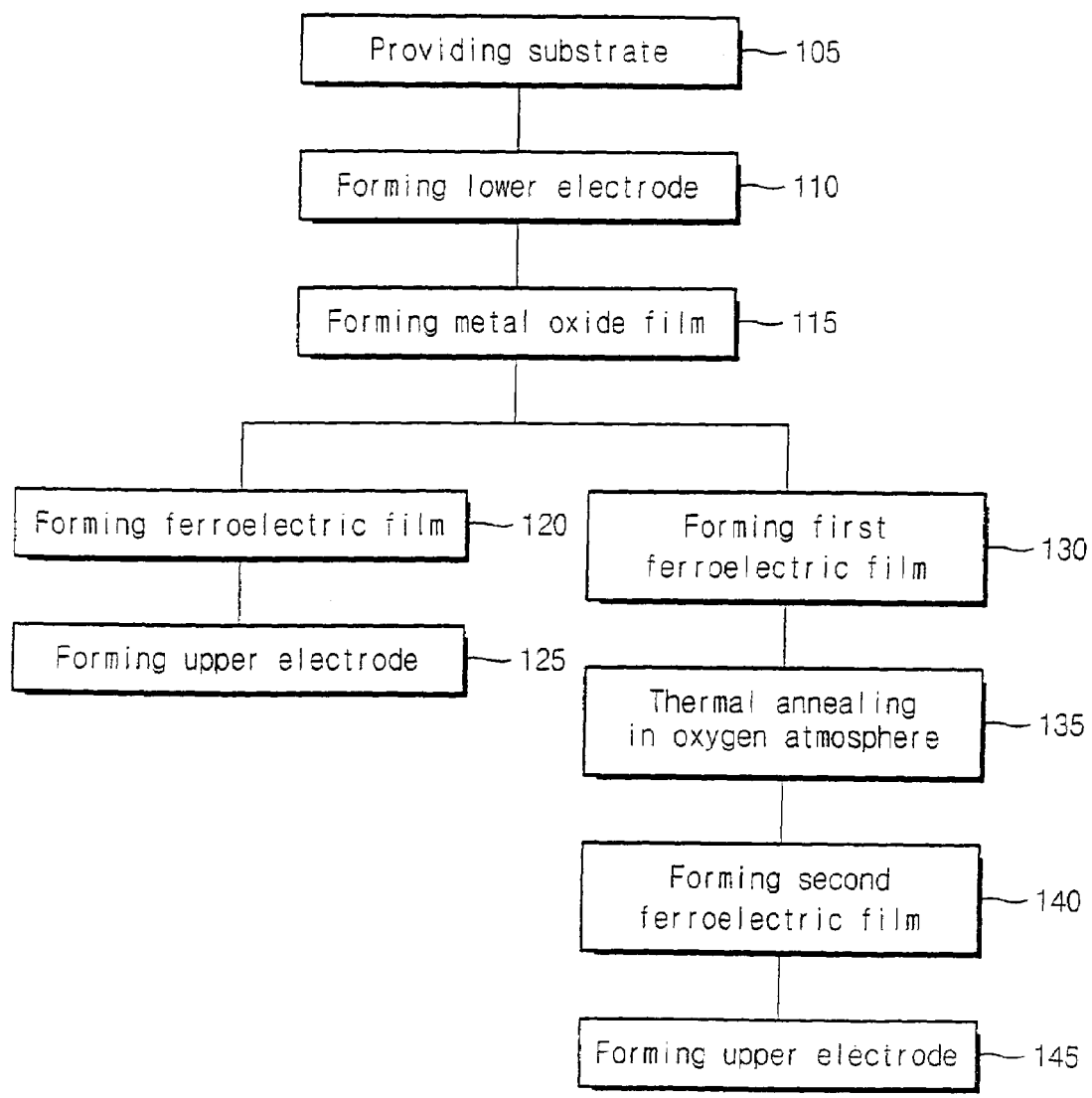
FIG. 2 is a process flow chart showing operations for forming a ferroelectric capacitor according to various embodiments the present invention.

FIG. 2 is a process flow chart showing operations for forming a ferroelectric capacitor according to various embodiments of the present invention.

A substrate is provided at Block 105. A lower electrode of a capacitor is formed on the substrate at Block 110. The lower electrode can be formed from iridium (Ir) or ruthenium (Ru). An upper surface of the lower electrode is oxidized to form a metal oxide film at Block 115. The metal oxide film can be formed from iridium oxide ($IrO_x$) or ruthenium oxide ($RuO_x$).

A ferroelectric film is formed on the lower electrode on the metal oxide film. In a first embodiment, at Block 120, the ferroelectric film is formed at an oxygen partial pressure that is higher than an oxygen partial pressure used when forming the metal oxide film. The higher oxygen partial pressure atmosphere used when forming the ferroelectric film may increase oxygen in the metal oxide film (oxygen enhanced metal oxide film), and may thereby reduce or inhibit the fatigue phenomenon. The formation of the metal oxide film at Block 115 and the formation of the ferroelectric film at Block 120 may be carried out in-situ in the same equipment. After the formation of the ferroelectric film, an upper electrode is formed at Block 125.

In a second embodiment of the present invention for the formation of the ferroelectric film, a metal organic chemical vapor deposition (MOCVD), a sol-gel, a sputtering or the like is used to form a thin first ferroelectric film at Block130. At Block 135, heat treatment is performed in-situ or ex-situ in an oxygen atmosphere to recharge oxygen into the metal oxide film, which may prevent oxygen in the metal oxide film from being reduced during the formation of the ferroelectric film. At Block 140 a second ferroelectric film is formed. At Block 145 a capacitor upper electrode is formed.

Figure 3A:
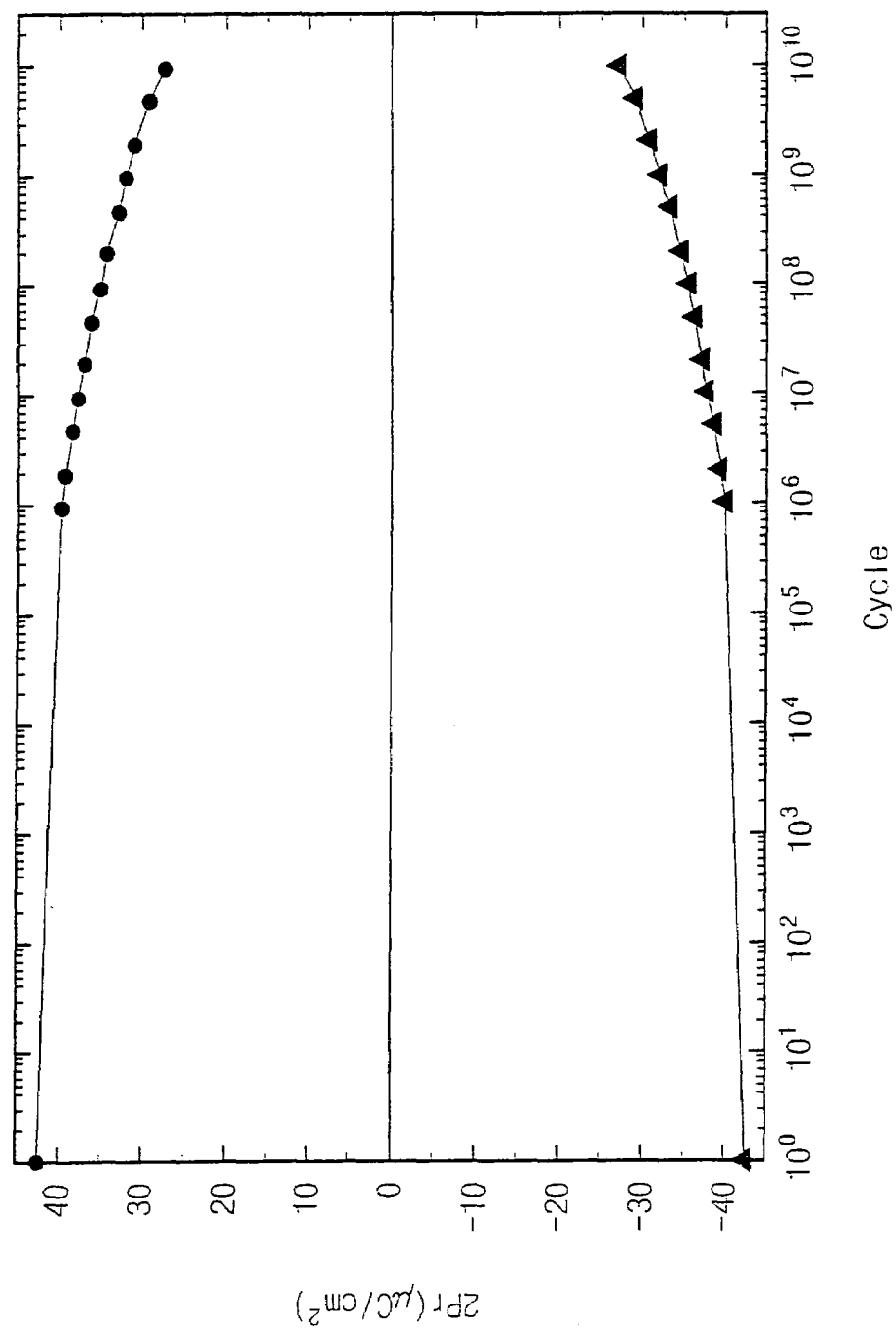
FIGS. 3A and 3B are graphs showing fatigue phenomena occurring in a conventional ferroelectric capacitor and a ferroelectric capacitor of the present invention, respectively.
Figure 3B:
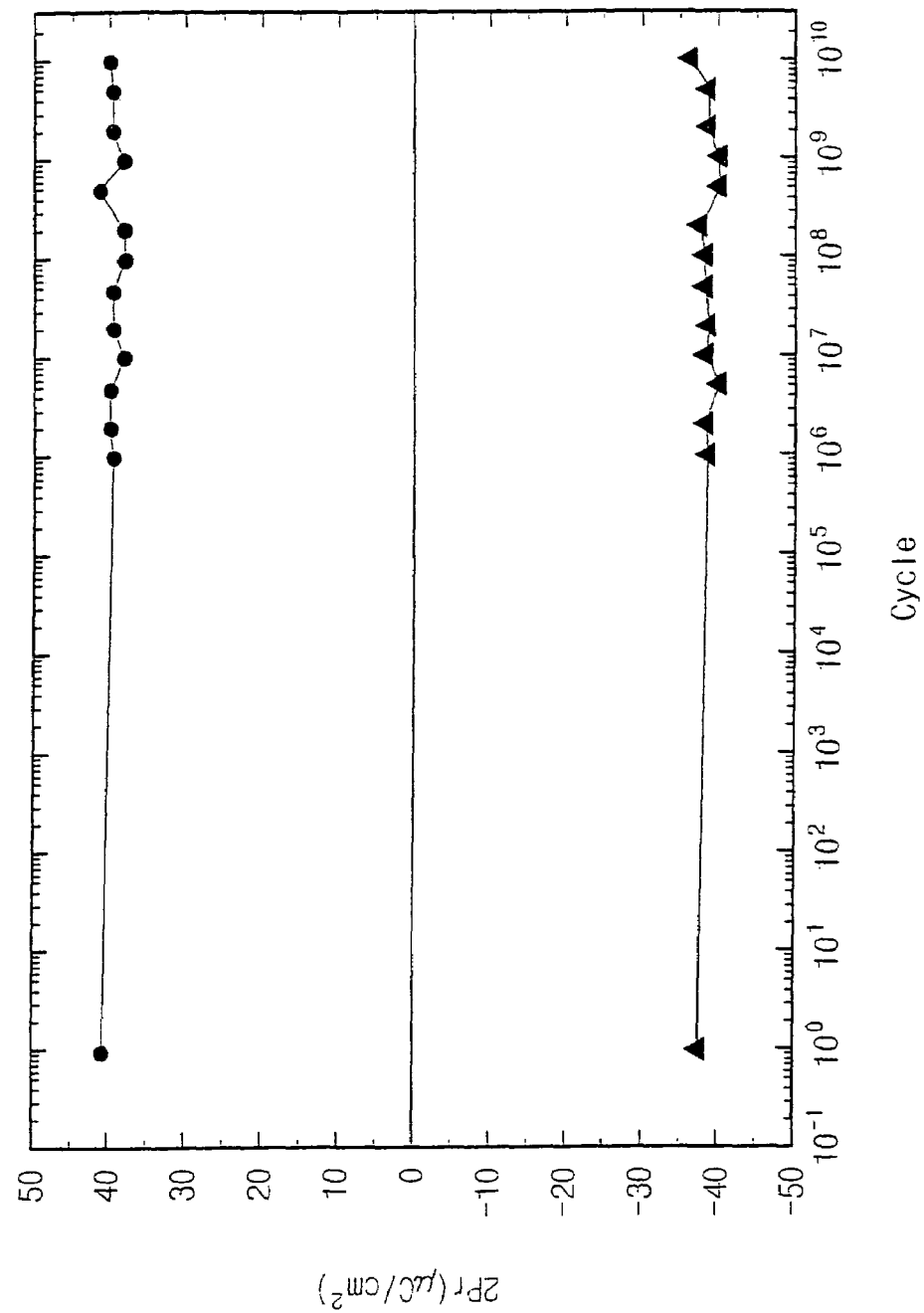

FIGS. 3A and 3B are graphs showing fatigue phenomena occurring, respectively, in a conventional ferroelectric capacitor and a ferroelectric capacitor according to embodiments of the present invention. The ferroelectric film used in the tests had an area of 100 $\mu$m×100 $\mu$m and a thickness of 1,200 Å.

FIG. 3A shows the results of a fatigue phenomenon in a conventional planar capacitor. The lower electrode is a hybrid electrode in which iridium (Ir) layer and iridium oxide ($IrO_x$) were stacked. The ferroelectric film is a PZT film that is formed by MOCVD. The upper electrode is an iridium layer. As shown in the graph of FIG. 3A, a fatigue phenomenon occurs as an initial remnant polarization value of 21.1 $\mu C/cm^2$ decreases to a remnant polarization value of 13.6 $\mu C/cm^2$ after cycles of $10^{10}$ times. This result is similar to a capacitor disclosed in the paper entitled "Hydrogen-Robust Submicron $IrO_x$/Pb(Zr, $Ti)O_3$/Ir Capacitor for Embedded Ferroelectric Memory" published on Jpn. J. Appl. Phys. Vol. 40 by Texas Instruments Inc. in 2001.

FIG. 3B shows results of a fatigue phenomenon in a planar capacitor according to various embodiments of the present invention. The lower electrode is formed from an iridium film. The upper surface of the iridium film is oxidized to form an iridium oxide ($IrO_x$). The iridium oxide is formed under process conditions of a temperature range from about 500° C. to about 550° C., a pressure range from about 1 Torr to about 10 Torr, an oxygen amount range from about 500 sccm to about 3,000 sccm, and an inert gas in an amount of about 500 sccm or less, and by exposing the iridium for 50 seconds or more. A ferroelectric film is then formed in-situ in the same equipment with a sufficient oxygen atmosphere and by MOCVD. As shown in the graph of FIG. 3B, the remnant polarization value decreases from 21.98 $\mu C/cm^2$ at an initial stage to 20.0 $\mu C/cm^2$, which indicates that the fatigue phenomenon was inhibited compared with the conventional planar capacitor shown in FIG. 3A.

Although planar capacitors have been discussed, the aforementioned method of fabricating ferroelectric capacitors can be applied to three-dimensional ferroelectric capacitors according to various embodiments of the present invention, such as to stack type or cylinder type capacitors. A semiconductor device including a three-dimensional stack type capacitor and fabrication method will now be described.

Figure 4:
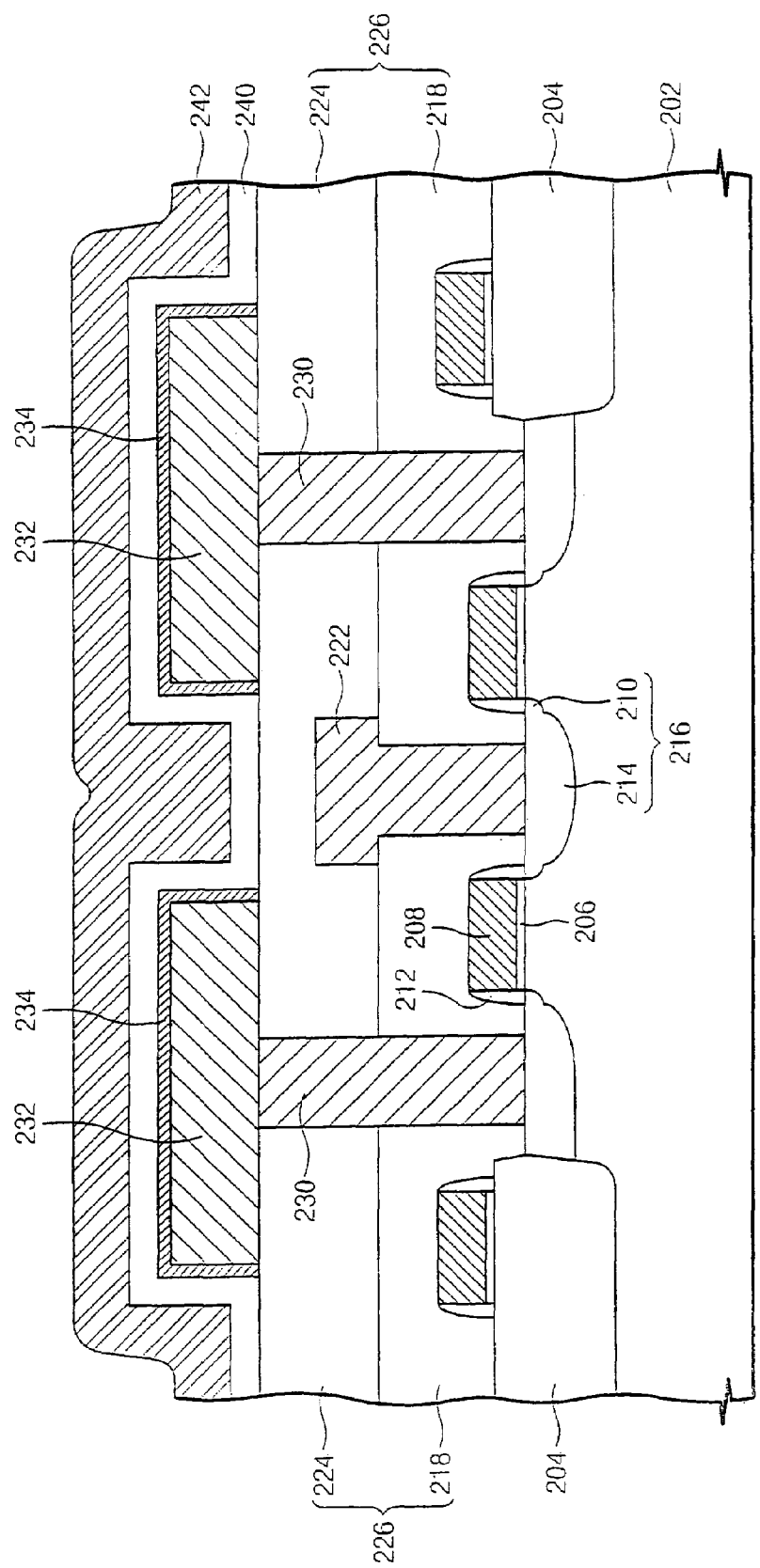
FIG. 4 is a sectional view of a semiconductor device having a stack type capacitor according to various embodiments of the present invention.

FIG. 4 is a sectional view of a semiconductor device including a stack type capacitor according various embodiments of the present invention. Referring to FIG. 4, a device isolation region (field oxide) 204 for defining active region is formed on a substrate 202. A gate electrode 208 is formed on the substrate 202 with a gate insulating film 206 interposed between the gate electrode 208 and the substrate 202. A gate spacer 212 is formed on sidewalls of the gate electrode 208. Source and drain regions 216 each consisting of a lightly doped region 210 and a heavily doped region 214 are formed in the substrate 202 adjacent to the gate electrode 208. On the substrate including the gate electrode 208 is formed a first interlayer insulating layer 218. A bit line 222 is formed such that it penetrates the first interlayer insulating layer 218 and electrically contacts with the drain region 216. A second interlayer insulating layer 224 is formed on the bit line 222 and the first interlayer insulating layer 218. A contact plug 230 is formed such that it penetrates an interlayer insulating layer 226 including the second interlayer insulating layer 224 and the first interlayer insulating layer 218 and electrically contacts with the source region 216. On the interlayer insulating layer 226 including the contact plug 230 is formed a stack type lower electrode 232 electrically connected with the contact plug 230. A metal oxide film 234 is conformally formed on the upper surface and the sidewalls of the lower electrode 232. A ferroelectric film 240 is conformally formed on the stack type lower electrode 232 covered with the metal oxide film 234 and on the interlayer insulating film 226. An upper electrode 242 is formed on the ferroelectric film 240. Improved device integration may be provided because the ferroelectric film 240 is formed on the sidewalls as well as the upper surface of the lower electrode 232.

A process of fabricating a semiconductor device having the stack type capacitor shown in FIG. 4 will now be discussed with reference to FIGS. 5A to 5D. FIGS. 5A to 5D are sectional views showing a process of fabricating a semiconductor device having a stack type capacitor according to a first embodiment of the present invention.

Figure 5A:
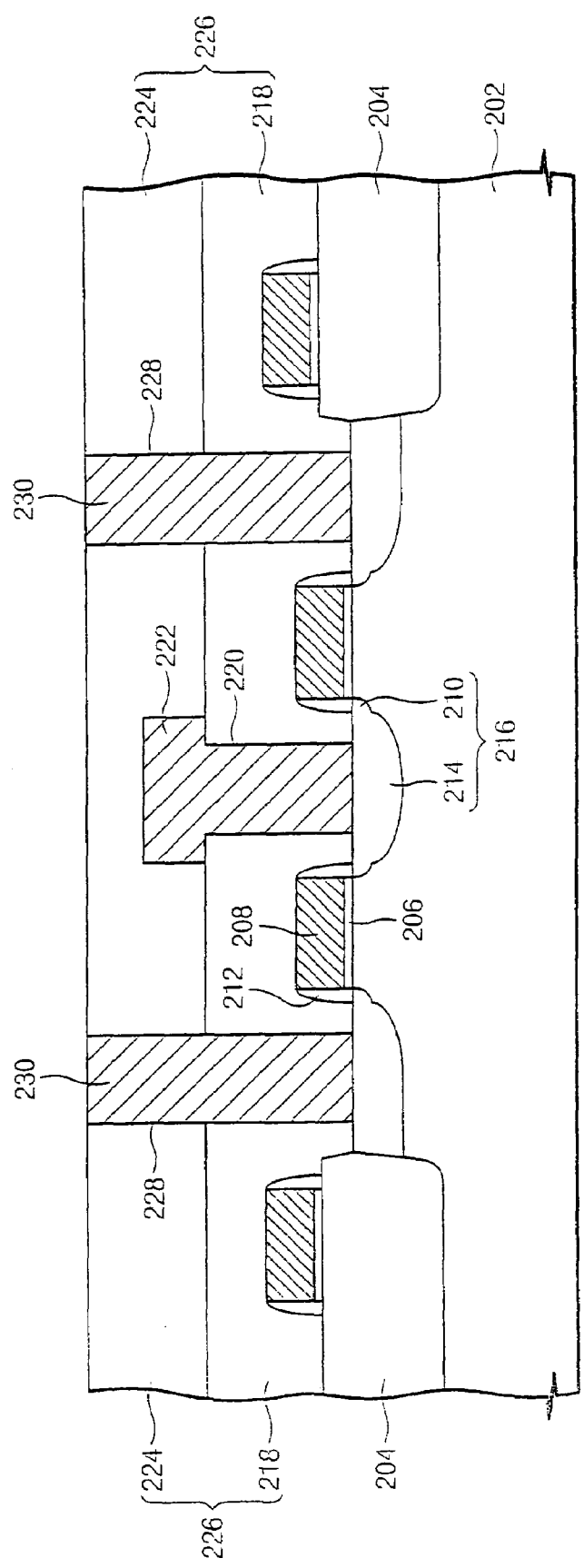
FIGS. 5A to 5D are sectional views showing fabrication of a semiconductor device having a stack type capacitor according to a first embodiment of the present invention.

Referring to FIG. 5A, device isolation regions 204 defining active regions are formed in a substrate 202. The device isolation region may be defined by a general LOCOS (Local Oxidation of Silicon) process, or it may be formed by various other processes such as shallow trench isolation (STI). A gate insulating film 206 and a gate conductive film 208 are sequentially deposited on the substrate 202 in which the active region has been defined. The gate conductive film 208 and the gate insulating film 206 are patterned to form a gate stack. A lightly doped impurity region 210 may be formed using the gate stack and the device isolation region 204 as the ion implantation mask. A spacer insulating film is formed on the entire surface of the substrate on which the gate stack is formed, and may then be anisotropically plasma-etched back to form a gate spacer 212 on the sidewalls of the gate stack. A heavily doped impurity region 214 is formed by, for example, using the gate stack, the gate space formed on the sidewalls of the gate stack and the device isolation region as the ion implantation mask. The lightly doped impurity region 210 and the heavily doped impurity region 214 may serve as a source and drain region 216. A first interlayer insulating layer 218 is formed on the entire surface of the substrate on which the gate stack is formed. The first interlayer insulating layer 218 may be planarized and then subject to a general photolithography process to form a bit line contact hole 220. A bit line 222 is formed which is electrically connected with the drain region 216 through the contact hole 220. A second interlayer insulating layer 224 is formed on the bit line 222 and the first interlayer insulating layer 218. An opening 228 is formed so as to penetrate the second interlayer insulating layer 224 and the fist interlayer insulating layer 218 and expose the source region 216 of the MOS transistor. The opening 228 is filled with polycrystalline silicon to form a conductive contact plug 230.

Figure 5B:
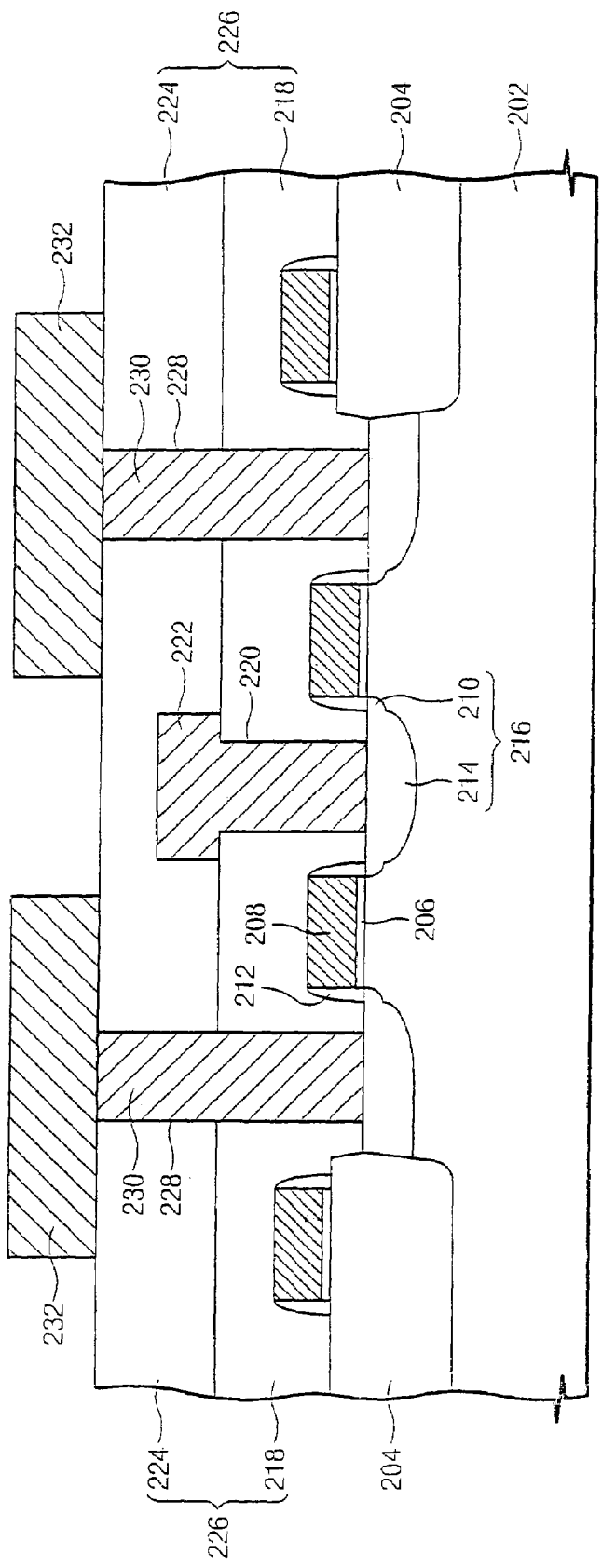

Referring to FIG. 5B, a lower electrode conductive film is formed on the interlayer insulating film 226 in which the contact plug 230 is formed, and may then be patterned by a photolithography process to form a stack type lower electrode 232 of a capacitor. The lower electrode conductive film may be formed of iridium (Ir) or ruthenium (Ru).

Figure 5C:
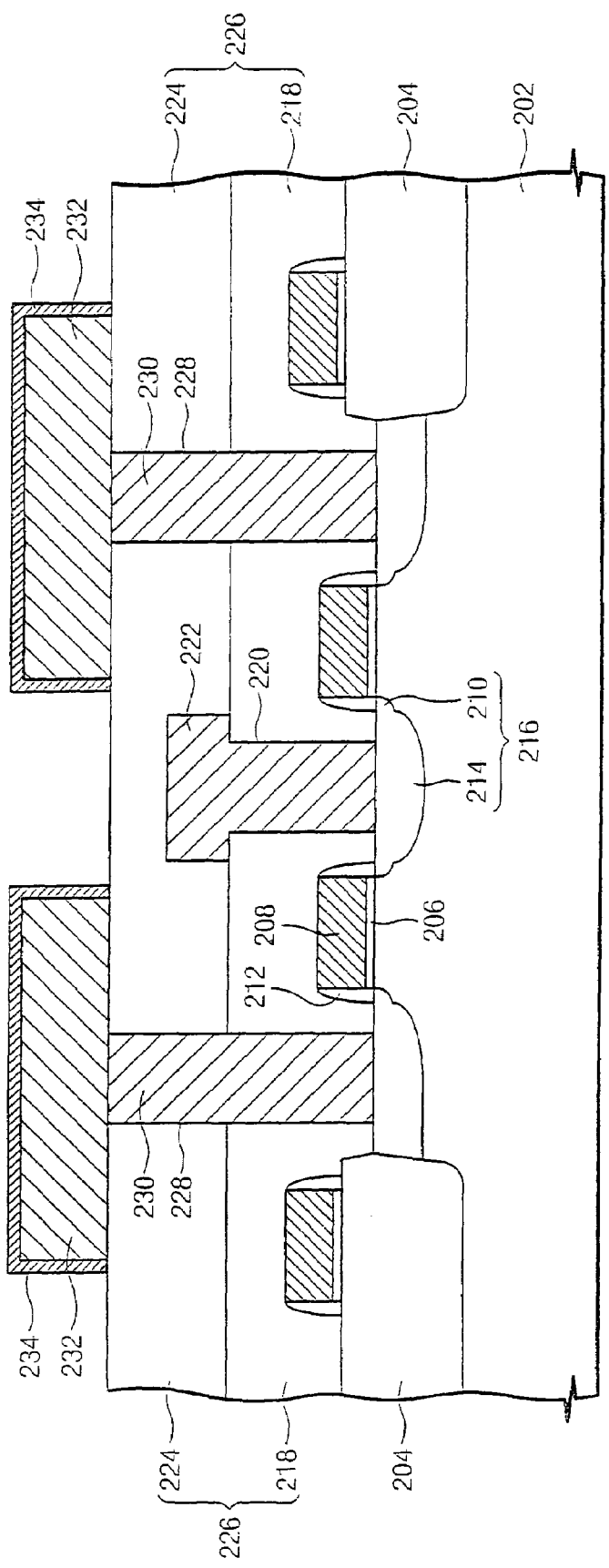

Referring to FIG. 5C, the stack type lower electrode 232 is oxidized in an oxygen atmosphere to form a metal oxide film 234. The metal oxide film 234 is formed on the upper surface and the sidewalls of the lower electrode 232 but not on the interlayer insulating layer. Accordingly, the metal oxide film does not need to be patterned to separate the lower electrodes.

The below chemical formula 1 is an oxidation reaction formula for iridium (Ir), and the chemical formula 2 is an oxidation reaction formula for ruthenium (Ru).

  Formula 1

  Formula 2

A specific process condition can be created to cause the surface of the lower electrode 232 to react with oxygen to form the metal oxide film 234. This oxidation reaction is influenced by the amount of oxygen, oxygen partial pressure, reaction temperature, pressure and surface properties of the lower electrode 232.

When the lower electrode 232 is formed from iridium (Ir), iridium oxides (IrOx) having different composition ratios may be formed responsive to variations in the ratio of the oxygen to which it is exposed. The iridium oxide may be formed by a process with a temperature range from about 500° C. to about 550° C., a pressure range from about 1 Torr to about 10 Torr, an oxygen range from about 500 sccm to about 3,000 sccm, and an inert gas in an amount of about 500 sccm or less and by exposing the surface of the lower electrode for about 10 seconds or more.

When the lower electrode 232 is formed from ruthenium (Ru), a metal oxide film may be formed according to the process described for an iridium lower electrode 232, or the ruthenium may be excessively oxidized and may be removed in a vapor state of $RuO_4$. In other words, it may be thermomechanically advantageous for the ruthenium to be decomposed and then discharged in a vapor phase when the temperature is relatively high at a low pressure.

Figure 5D:
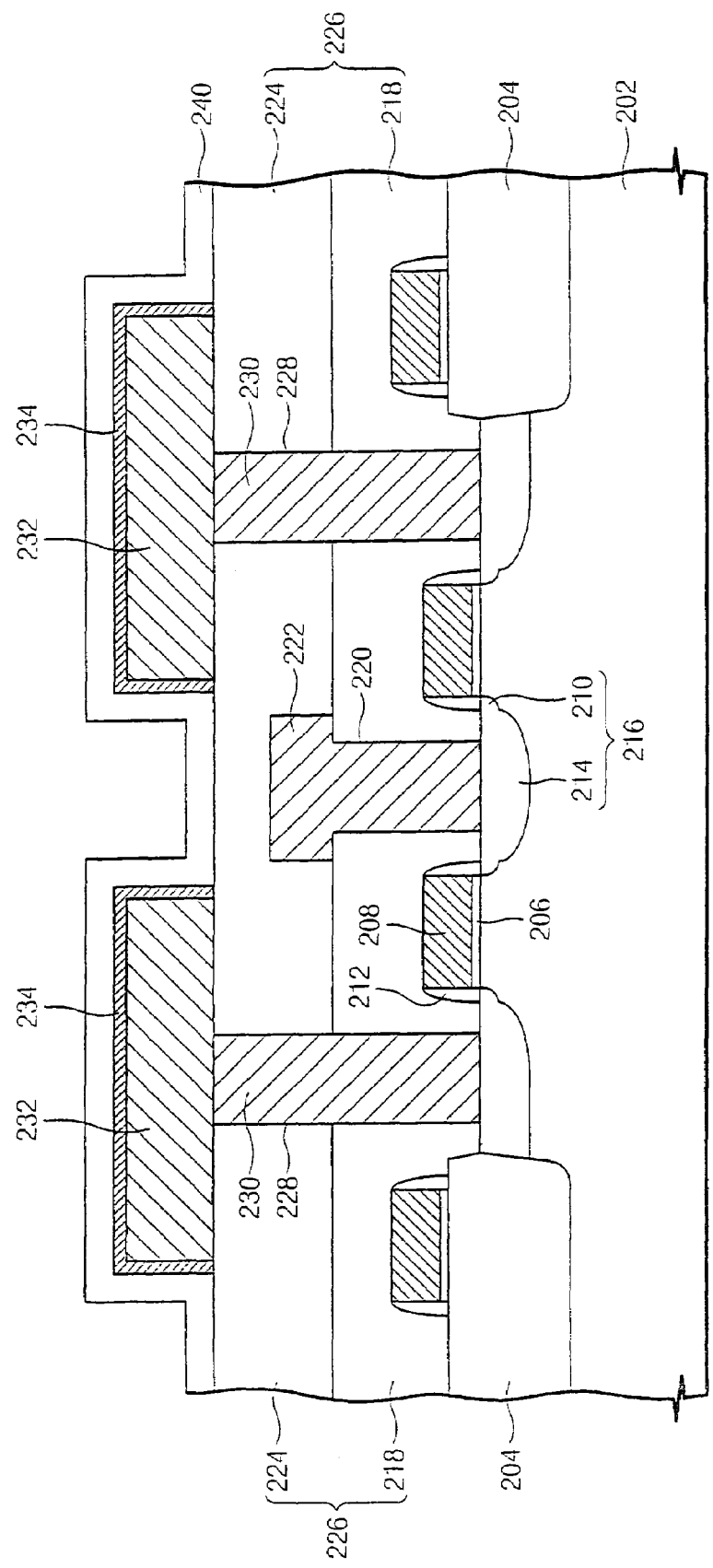

Referring to FIG. 5D, a ferroelectric film 240 is conformally formed on the lower electrode 232 on which the metal oxide film 234 is formed and on the interlayer insulating layer 226. The ferroelectric film may be formed from one or more materials selected from a group consisting of PZT, SBT, SBTN and BLT, and which can contain dopants such as Bi—SiOx, Ca, Mn and/or La. The ferroelectric film may be formed while supplying source gas, oxygen gas and/or other inert gas.

The formation of the ferroelectric film may be carried out in-situ in the same equipment where the metal oxide film is formed by oxidizing the lower electrode 232. The in-situ process may provide advantages of simplifying the fabrication process and reducing the occurrence of defects.

When forming the ferroelectric film, it is can be important to not reduce, or inhibit reduction, of the amount of oxygen in the metal oxide film 234. If the amount of oxygen used when forming the ferroelectric film is not sufficient, or if the relative oxygen partial pressure decreases during the deposition of the ferroelectric film, such as by the introduction of a source gas, oxygen gas and other inert gas, oxygen may be removed from the metal oxide film and thereby reduce the metal oxide film. Reduction of the metal oxide film during formation of the ferroelectric film can be associated with an increase in the fatigue phenomenon. Accordingly, it may be advantageous to inhibit reduction of the oxygen in the metal oxide film by, for example, maintaining a sufficient oxygen partial pressure at an initial stage of the deposition of the ferroelectric film. What oxygen partial pressure is sufficient can vary with the particular process conditions such as pressure, temperature or the like. Use of an amount of oxygen that exceeds the quantitative amount of oxygen necessary for the purpose of forming the ferroelectric film may be sufficient to inhibit or avoid the loss of oxygen from, and reduction of, the metal oxide.

An upper electrode conductive film is formed on the ferroelectric film 240 and then patterned to form an upper electrode. By the aforementioned steps, the resultant structure shown in FIG. 4 may be obtained.

Figure 6B:
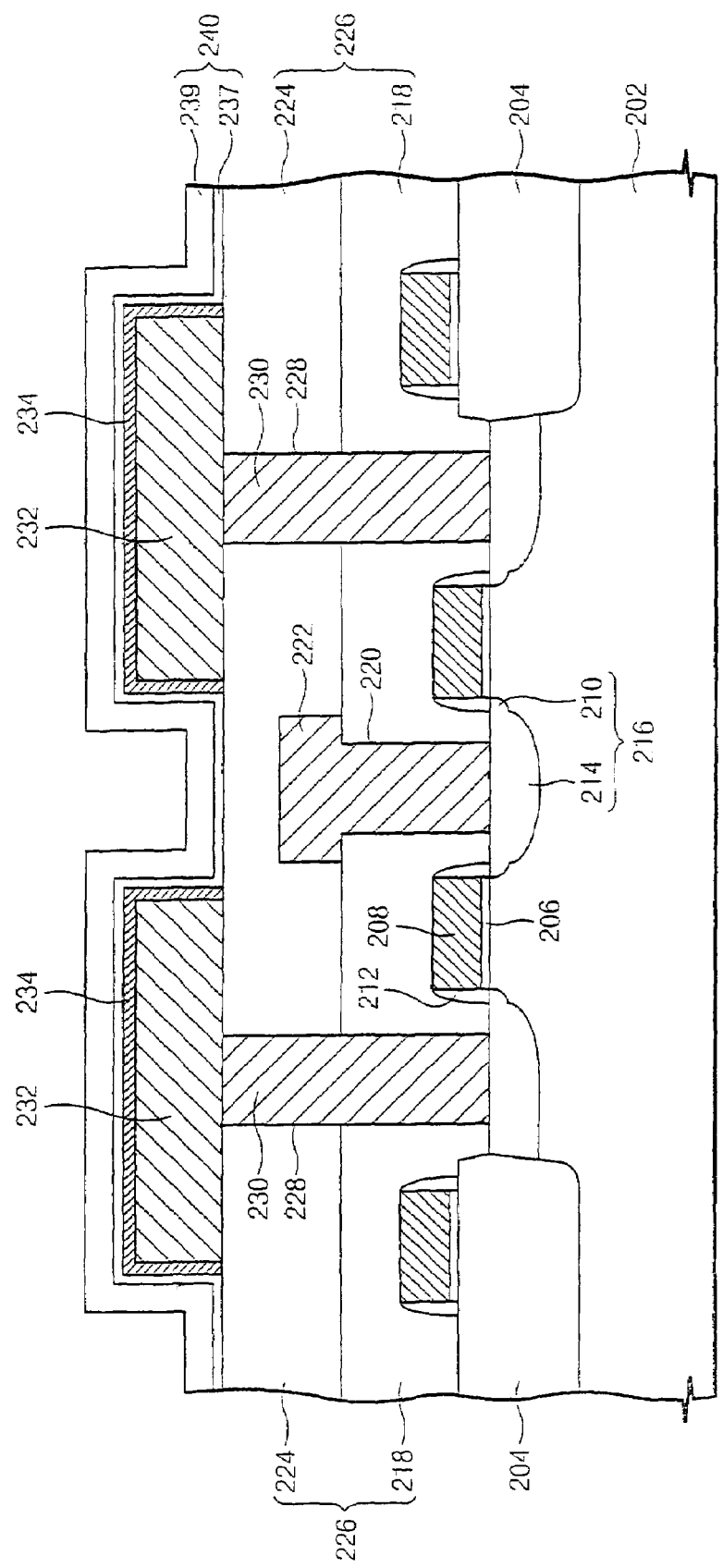

FIGS. 6A to 6B are sectional views showing a method of fabricating a semiconductor device having a stack type capacitor according to a second embodiment of the present invention.

Referring to FIG. 6A, a thin first ferroelectric film 237 is formed on the lower electrode 232, on which the metal oxide film 234 is formed. The resultant structure is thermally annealed in-situ and/or ex-situ in an oxygen atmosphere to recharge (i.e., increase) oxygen into the metal oxide film, which may inhibit or reduce the fatigue phenomenon by further oxidizing the metal oxide film to replace oxygen that may have been removed during the formation of the first ferroelectric film.

Referring to FIG. 6B, a second ferroelectric film 239 is formed on the first ferroelectric film 237 to create a ferroelectric film 240 of a capacitor. An upper electrode conductive film may be formed on the ferroelectric film 240 and then patterned to form an upper electrode and provide, for example, the structure shown in FIG. 4.

As has been described with regard to various embodiments of the present invention, a capacitor lower electrode is formed, a the metal oxide film is formed on the lower electrode, and a ferroelectric film is formed thereon under process conditions so that reduction in oxygen content of the metal oxide film is inhibited or avoided. Consequently, the fatigue phenomenon of the ferroelectric film may be inhibited or avoided. Moreover, by forming the ferroelectric film in-situ after forming the metal oxide film from an oxidation of the upper surface of the capacitor lower electrode, the fabrication process may be simplified and defects and the fatigue phenomenon may be reduced. When forming a three-dimension capacitor lower electrode, the metal oxide film can be formed by oxidizing the surface of the three-dimensional lower electrode so that the surface of the metal oxide film may have more uniform properties when forming a ferroelectric film, and which may thereby avoid the need for a separate photolithography process, simplify the fabrication process, and facilitate device integration.

While the present invention has been described in detail, it should be understood that various changes, substitutions and alterations could be made hereto without departing from the spirit and scope of the invention as defined by the appended claims.

What is claimed is:

1. A ferroelectric capacitor comprising:
   a lower electrode on a substrate, the lower electrode comprising a metal film in which a surface portion of the metal film is oxidized as a metal oxide film;
   a ferroelectric film on the metal oxide film and the substrate, wherein the ferroelectric film comprises a first ferroelectric film having increased oxygen along an upper surface opposite from the metal oxide film and a second ferroelectric film on the increased oxygen surface of the first ferroelectric film; and
   an upper electrode on the second ferroelectric film.

2. The ferroelectric capacitor of claim 1, wherein the lower electrode and the upper electrode comprise iridium.

3. The ferroelectric capacitor of claim 1, wherein the lower electrode and the upper electrode comprise ruthenium, iridium, platinum, or a combination thereof.

4. The ferroelectric capacitor of claim 1, wherein the ferroelectric film comprises PZT, SBT, SBTN, BLT, or a combination thereof.

5. The ferroelectric capacitor of claim 1, wherein the lower electrode comprises a stack type electrode.

6. The ferroelectric capacitor of claim 1, wherein the first ferroelectric film is thinner than the second ferroelectric film.

7. A semiconductor device comprising:
   a MOS transistor on a substrate;
   an interlayer insulating layer on the substrate and the MOS transistor;
   a contact plug that penetrates the interlayer insulating layer and is electrically connected with a source region of the MOS transistor;
   a stack type lower electrode on the interlayer insulating layer and electrically connected with the contact plug, the lower electrode comprising a metal film in which an upper surface and sidewall surface portions of the metal film are oxidized as a metal oxide film;
   a ferroelectric film on the metal oxide film and the interlayer insulating layer, wherein the ferroelectric film comprises a first ferroelectric film having increased oxygen along an upper surface opposite from the metal oxide film and a second ferroelectric film on the increased oxygen surface of the first ferroelectric film; and
   an upper electrode on the second ferroelectric film.

8. The semiconductor device of claim 7, wherein the lower electrode comprises indium and the metal oxide film comprises iridium oxide.

9. The semiconductor device of claim 8, wherein the ferroelectric film comprises PZT.

* * * * *

UNITED STATES PATENT AND TRADEMARK OFFICE
CERTIFICATE OF CORRECTION

PATENT NO. : 6,987,308 B2  Page 1 of 1
APPLICATION NO. : 11/009809
DATED : January 17, 2006
INVENTOR(S) : Lee et al.

It is certified that error appears in the above-identified patent and that said Letters Patent is hereby corrected as shown below:

Column 8,
Line 35, should read -- lower electrode comprises iridium and the metal oxide film --

Signed and Sealed this

First Day of August, 2006

JON W. DUDAS
*Director of the United States Patent and Trademark Office*